United States Patent
Sturzebecher et al.

(10) Patent No.: US 10,601,398 B2
(45) Date of Patent: Mar. 24, 2020

(54) BAW STRUCTURE HAVING MULTIPLE BAW TRANSDUCERS OVER A COMMON REFLECTOR, WHICH HAS REFLECTOR LAYERS OF VARYING THICKNESSES

(71) Applicant: Qorvo US, Inc., Greensboro, NC (US)

(72) Inventors: Dana Jay Sturzebecher, Cary, NC (US); Larry Charles Witkowski, Plano, TX (US); Arthur Donald Ballato, Pinehurst, NC (US); Andrew Arthur Ketterson, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/953,080

(22) Filed: Apr. 13, 2018

(65) Prior Publication Data
US 2019/0319602 A1    Oct. 17, 2019

(51) Int. Cl.
| | |
|---|---|
| *H03H 9/54* | (2006.01) |
| *H03H 9/205* | (2006.01) |
| *H03H 9/56* | (2006.01) |
| *H03H 3/02* | (2006.01) |
| *H03H 9/05* | (2006.01) |

(Continued)

(52) U.S. Cl.
CPC .............. *H03H 9/205* (2013.01); *H03H 3/02* (2013.01); *H03H 9/02031* (2013.01); *H03H 9/02062* (2013.01); *H03H 9/0561* (2013.01); *H03H 9/175* (2013.01); *H03H 9/564* (2013.01); *H03H 9/568* (2013.01); *H03H 2003/025* (2013.01)

(58) Field of Classification Search
CPC .......... H03H 9/54; H03H 9/915; H03H 9/175; H03H 9/15
USPC .......................................... 333/133, 187-192
See application file for complete search history.

(56) References Cited

U.S. PATENT DOCUMENTS

| | | | | |
|---|---|---|---|---|
| 6,107,721 A | * | 8/2000 | Lakin | ...................... H03H 9/564 310/321 |
| 6,407,649 B1 | * | 6/2002 | Tikka | ................... H03H 9/0571 29/25.35 |

(Continued)

OTHER PUBLICATIONS

Atthi, N., et al., "Fabrication of Three-Dimensional Microstructures by One-Step Lithography with Multi-Film Thickness Mask," 2008 5th International Conference on Electrical Engineering/Electronics, Computer, Telecommunications and Information Technology, May 14-17, 2008, Krabi, Thailand, pp. 793-796.

(Continued)

*Primary Examiner* — Dean O Takaoka
(74) *Attorney, Agent, or Firm* — Withrow & Terranova, P.L.L.C.

(57) ABSTRACT

A BAW device includes a substrate, a first reflector, and at least two BAW transducers. The first reflector resides over the substrate and has a plurality of reflector layers. A first BAW transducer resides over a first section of the first reflector, has a first series resonance frequency, and has a first piezoelectric layer of a first thickness between a first top electrode and a first bottom electrode. The second BAW transducer resides over a second section of the first reflector, has a second series resonance frequency that is different than the first series resonance frequency, and has a second piezoelectric layer of a second thickness, which is different than the first thickness, between a second top electrode and a second bottom electrode.

24 Claims, 12 Drawing Sheets

(51) Int. Cl.
H03H 9/17 (2006.01)
H03H 9/02 (2006.01)

(56) References Cited

U.S. PATENT DOCUMENTS

| | | | | |
|---|---|---|---|---|
| 6,441,703 | B1* | 8/2002 | Panasik | H03H 9/589 29/25.35 |
| 6,518,860 | B2* | 2/2003 | Ella | H03H 3/04 29/25.35 |
| 7,439,824 | B2* | 10/2008 | Aigner | H03H 9/02118 333/187 |
| 7,554,244 | B1 | 6/2009 | Ballato | |
| 7,684,109 | B2* | 3/2010 | Godshalk | H03H 3/04 359/245 |
| 7,795,998 | B2* | 9/2010 | Mayer | H03H 9/175 310/335 |
| 2005/0012570 | A1* | 1/2005 | Korden | H03H 9/0095 333/189 |
| 2015/0380634 | A1* | 12/2015 | Henn | H03H 9/0547 310/344 |

OTHER PUBLICATIONS

Ballato, A., "Comment on 'Bulk acoustic wave analysis of crystalline-plane-oriented aluminum nitride films'," Japanese Journal of Applied Physics, vol. 54, No. 9, Article No. 0099101, Aug. 4, 2015.

Ballato, A., "Resonance in Piezoelectric Vibrators," Proceedings of the IEEE, vol. 58, Issue 1, Jan. 1970, pp. 149-151.

Bond, W. L., et al., "The Elastic Constants of Germanium Single Crystals," Physical Review, vol. 78, No. 2, Apr. 15, 1950, p. 176.

Chen, D., et al., "Solidly mounted resonators operated in thickness shear mode based on c-axis oriented AlN films," Sensors and Actuators A, vol. 165, Available online Nov. 25, 2010, pp. 379-384.

Chen, D., et al., "The AlN based solidly mounted resonators consisted of the all-metal conductive acoustic Bragg reflectors," Vacuum, vol. 85, Jul. 1, 2010, pp. 302-306.

Danicki, E., "Unified theory of interdigital transducers and SAW reflectors," Journal of Technical Physics, vol. 21, No. 3, 1980, pp. 387-403.

Danicki, E., et al., "SAW dispersive delay line utilising apodised IDT with periodic electrodes," Electronics Letters, vol. 22, No. 19, Sep. 11, 1986, pp. 976-977.

Enlund, J., et al., "Solidly mounted thin film electro-acoustic resonator utilizing a conductive Bragg reflector," Sensors and Actuators A, vol. 141, Available online Sep. 14, 2007, pp. 598-602.

Featherson, F. H., et al., "Elastic Constants of Tantalum, Tungsten, and Molybdenum," Physical Review, vol. 130, No. 4, May 15, 1963, pp. 1324-1333.

Henke, W., et al., "Simulation and experimental study of gray-tone lithography for the fabrication of arbitrarily shaped surfaces," Proceedings of the IEEE Micro Electro Mechanical Systems an Investigation of Micro Structures, Sensors, Actuators, Machines and Robotic Systems, Jan. 25-28, 1994, Oiso, Japan, pp. 205-210.

IEEE, "Standard Definitions and Methods of Measurement for Piezoelectric Vibrators," The Institute of Electrical and Electronics Engineers Inc., New York, May 23, 1966, IEEE No. 177, 20 pages.

Kim, T., et al., "High-temperature electromechanical characterization of A$\ell$ single crystals," IEEE Transactions on Ultrasonics, Ferroelectrics, and Frequency Control, vol. 62, Issue 10, Oct. 2015, pp. 1880-1887.

Kinsman, R. G., "A History of Crystal Filters," Proceedings of the 1998 IEEE International Frequency Control Symposium, May 29, 1998, Pasadena, California, USA, pp. 563-570.

Kushibiki, J., et al., "Accurate Measurements of the Acoustical Physical Constants of LiNbO3 and LiTaO3 Single Crystals," IEEE Transactions on Ultrasonics, Ferroelectrics, and Frequency Control, vol. 46, Issue 5, Sep. 1999, pp. 1315-1323.

Lebrasseur, E., et al., "Design and fabrication of an acoustic bragg mirror for miniaturized quartz resonators," Société Française d'Acoustique, Acoustics 2012, Apr. 23, 2012, 7 pages.

Lecompte, M., et al., "Photoresist characterization and linearization procedure for the gray-scale fabrication of diffractive optical elements," Applied Optics, vol. 40, No. 32, Nov. 10, 2001, pp. 5921-5927.

McSkimin, H. J., et al., "Measurement of the Elastic Constants of Silicon Single Crystals and Their Thermal Coefficients," Physical Review, vol. 83, No. 5, Sep. 1, 1951, p. 1080.

McSkimin, H. J., et al., "The Elastic Stiffness Moduli of Diamond," Journal of Applied Physics, vol. 43, No. 3, Mar. 1972, pp. 985-987.

Morgan, B. C., "Development of a deep silicon phase Fresnel lens using gray-scale lithography and deep reactive ion etching," Thesis submitted to the Faculty of the Graduate School of the University of Maryland, College Park in partial fulfillment of the requirements for the degree of Master of Science, Department of Electrical and Computer Engineering, University of Maryland, 2004, 120 pages.

Mosher, L., "Double-Exposure Grayscale Photolithography," Thesis submitted to the Faculty of the Graduate School of the University of Maryland, College Park in partial fulfillment of the requirements for the degree of Master of Science, Department of Electrical and Computer Engineering, University of Maryland, 2008, 121 pages.

Mosher, L., et al., "Double-Exposure Grayscale Photolithography," Journal of Microelectromechanical Systems, vol. 18, No. 2, Apr. 2009, pp. 308-315.

Mouldi, A., et al., "Design of microwave devices exploiting Fibonacci and hybrid periodic/Fibonacci one dimensional photonic crystals," Progress in Electromagnetics Research B, vol. 40, Issue 40, Jan. 2012, pp. 221-240.

Mouldi, A., et al., "Design of optical devices based on hybrid periodic/Fibonacci photonic crystal in the visible and the near infrared domains," Progress in Electromagnetics Research M, vol. 32, Jan. 2013, pp. 169-180.

Pabst, W., et al., "Elastic properties of silica polymorphs—A review," Ceramics — Silikáty, vol. 57, No. 3, Sep. 20, 2013, pp. 167-184.

Paschotta, R., "Bragg Mirrors," RP Photonics Encyclopedia, Available online at: <<https://www.rp-photonics.com/bragg_mirrors.html>>, Accessed Aug. 1, 2018, 3 pages.

Paschotta, R., "Chirped Mirrors," RP Photonics Encyclopedia, Available online at: <<https://www.rp-photonics.com/chirped_mirrors.html>>, Accessed Aug. 1, 2018, 4 pages.

Reilly, J. P., et al., "The design of SAW bandpass filters exhibiting arbitrary phase and amplitude response characteristics," IEEE Transactions on Sonics and Ultrasonics, vol. 24, Issue 5, Sep. 1977, pp. 301-304.

Rostami, A., "Superimposed Bragg gratings using Fibonacci quasiperiodic crystals," Proceedings of the 2005 13th IEEE International Conference on Networks Jointly held with the 2005 IEEE 7th Malaysia International Conference on Communications, Nov. 16-18, 2005, Kuala Lumpur, Malaysia, pp. 279-283.

Sheppard, C. J. R., "Approximate calculation of the reflection coefficient from a stratified medium," Pure Applied Optics A, vol. 4, No. 5, Mar. 21, 1995, pp. 665-669.

Stilson, C., et al., "Micro-contact Resistance of Au—Au on Engineered Contact Surfaces using Gray-scale Lithography," Proceedings of the 27th International Conference on Electrical Contacts, Jun. 22-26, 2014, Dresden, Germany, pp. 381-386.

Sutton, P. M., "The Variation of the Elastic Constants of Crystalline Aluminum with Temperature between 63° K and 773° K," Physical Review, vol. 91, No. 4, Aug. 15, 1953, pp. 816-821.

Szipöcs, R., et al., "Chirped multilayer coatings for broad-band dispersion control in femtosecond lasers," Optics Letters, vol. 19, No. 3, Feb. 1, 2004, pp. 201-203.

Waits, C. M., et al., "Gray-Scale Lithography for MEMS Applications," Research paper submitted to the Department of Electrical and Computer Engineering, The Institute for Systems Research, University of Maryland, College Park, Jan. 2006, 2 pages.

Waits, C. M., et al., "Investigation of gray-scale technology for large area 3D silicon MEMS structures," Journal of Micromechanics and Microengineering, vol. 13, Dec. 24, 2002, pp. 170-177.

(56) References Cited

OTHER PUBLICATIONS

Waits, C. M., et al., "Mems-based gray-scale lithography," Proceedings of the 2001 International Semiconductor Device Research Symposium, Dec. 5-7, 2001, Washington, DC, USA, pp. 182-185.
Waits, C. M., et al., "Microfabrication of 3D silicon MEMS structures using gray-scale lithography and deep reactive ion etching," Sensors and Actuators A, vol. 119, Available online Apr. 24, 2004, pp. 245-253.

* cited by examiner

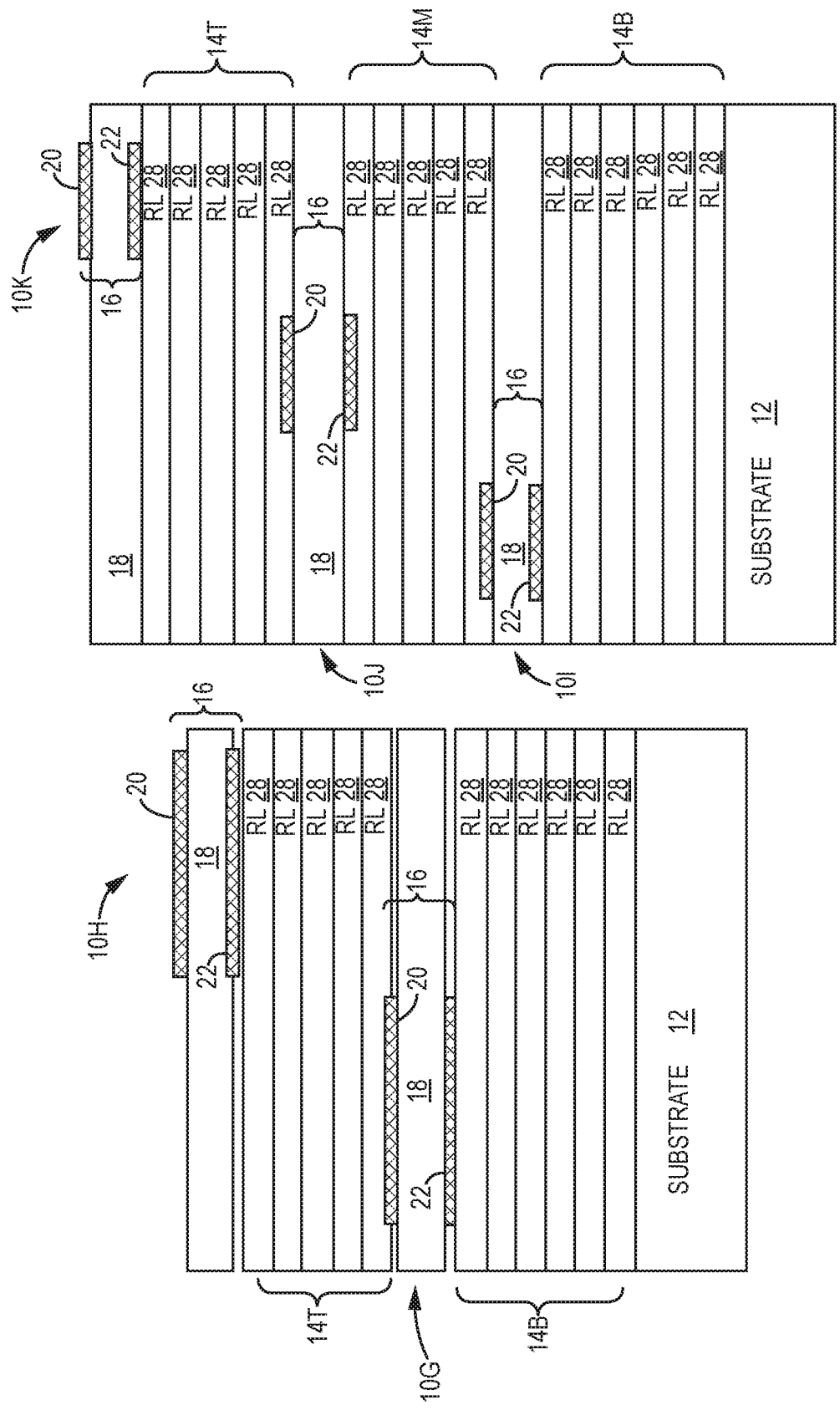

BAW STRUCTURE HAVING MULTIPLE BAW TRANSDUCERS OVER A COMMON REFLECTOR, WHICH HAS REFLECTOR LAYERS OF VARYING THICKNESSES

FIELD OF THE DISCLOSURE

The present invention relates to a BAW structure having multiple BAW transducers over a common reflector, which has reflector layers of varying thicknesses.

BACKGROUND

Acoustic resonators, and particularly Bulk Acoustic Wave (BAW) resonators, are used in many high frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

A BAW device includes a substrate, a first reflector, and at least two BAW transducers. The first reflector resides over the substrate and has a plurality of reflector layers. A first BAW transducer resides over a first section of the first reflector, has a first series resonance frequency, and has a first piezoelectric layer of a first thickness between a first top electrode and a first bottom electrode. The second BAW transducer resides over a second section of the first reflector, has a second series resonance frequency that is different than the first series resonance frequency, and has a second piezoelectric layer of a second thickness, which is different than the first thickness, between a second top electrode and a second bottom electrode.

In the first section of the first reflector beneath the first BAW transducer, each of at least two of the first plurality of reflector layers has a third thickness approximately one-quarter the wavelength ($\lambda/4$) of an acoustic wave for a frequency at which an acoustic mode of a first type operates in the first BAW transducer. The acoustic mode of the first type may be, but is not limited to a longitudinal mode, a shear mode, a quasi-longitudinal mode, and a quasi-shear mode. In the second section of the first reflector beneath the second BAW transducer, each of at least two of the first plurality of reflector layers has a fourth thickness approximately one-quarter the wavelength ($\lambda/4$) of an acoustic wave for a frequency at which the acoustic mode of the first type operates in the first BAW transducer. The third and fourth thicknesses are different from one another.

If the acoustic mode of the first type is a longitudinal mode, each of at least two of the reflector layers of the first reflector in the first section has a thickness approximately one-quarter the wavelength ($\lambda/4$) of a longitudinal acoustic wave at the first series resonance frequency of the first transducer. Similarly, in the second section of the first reflector beneath the second transducer, each of the at least two reflector layers has a thickness approximately one-quarter the wavelength ($\lambda/4$) of a longitudinal acoustic wave at the second series resonance frequency of the second transducer. The thicknesses of at least two reflector layers in the first section of the first reflector are different than thicknesses of at least two reflector layers in the second section of the first reflector. In certain embodiments, the at least two reflector layers are adjacent one another.

In one embodiment, in the first section of the first reflector beneath the first transducer, each of at least four of the reflector layers has a thickness approximately one-quarter the wavelength ($\lambda/4$) of a longitudinal acoustic wave at the first series resonance frequency of the first transducer. In the second section of the first reflector beneath the second transducer, each of at least four of the reflector layers has a thickness approximately one-quarter the wavelength ($\lambda/4$) of a longitudinal acoustic wave at the second series resonance frequency of the second transducer, wherein there are no intervening layers between any of the at least four of the first plurality of reflector layers.

In one embodiment, the BAW device includes at least a third BAW transducer over a third section of the first reflector. The BAW transducer has a third series resonance frequency that is different than the first series resonance frequency and the second series resonance frequency, and the BAW transducer includes a third piezoelectric layer of a third thickness between a third top electrode and a third bottom electrode. The third thickness is different from the first thickness and the second thickness. Each of at least two of the first plurality of the reflector layers in the third section of the first reflector beneath the third transducer has a thickness approximately one-quarter the wavelength ($\lambda/4$) of a longitudinal acoustic wave at the third series resonance frequency of the third transducer.

In many embodiments, the first piezoelectric layer of the first BAW transducer has a thickness approximately one-half the wavelength ($\lambda/2$) of the longitudinal acoustic wave at the first series resonance frequency of the first transducer. The second piezoelectric layer of the second BAW transducer has a thickness approximately one-half the wavelength ($\lambda/2$) of the longitudinal acoustic wave at the second series resonance frequency of the second transducer. The third piezoelectric layer of the third BAW transducer has a thickness approximately one-half the wavelength ($\lambda/2$) of the longitudinal acoustic wave at the third series resonance frequency of the third transducer.

For embodiments with stacked reflectors, at least a second reflector resides over the substrate and has a plurality of reflector layers. In particular, a fourth BAW transducer resides over a first section of the second reflector and includes a fourth piezoelectric layer between a fourth top electrode and a fourth bottom electrode. A fifth BAW transducer resides over a second section of the second reflector and includes a fifth piezoelectric layer between a fifth top electrode and a fifth bottom electrode. A series resonance frequency of the fourth BAW transducer is different than a series resonance frequency of the fifth BAW transducer, and a thickness of the fourth piezoelectric layer is different than a thickness of the fifth piezoelectric layer.

Further, each of at least two of the second plurality of the reflector layers in the first section of the second reflector beneath the fourth transducer has a thickness approximately one-quarter the wavelength (λ/4) of a longitudinal acoustic wave at the series resonance frequency of the fourth transducer. Each of at least two of the first plurality of the reflector layers in the second section of the second reflector beneath the fifth transducer has a thickness approximately one-quarter the wavelength (λ/4) of a longitudinal acoustic wave at the series resonance frequency of the fifth transducer. The fourth BAW transducer may be laterally aligned over the first BAW transducer, and the fifth BAW transducer may be laterally aligned over the second BAW transducer. The fourth or fifth BAW transducers may also be laterally offset from the first or second BAW transducers, respectively, such that the fourth or fifth BAW transducers only partially overlap the first or second BAW transducers. Alternatively, the transducers may be laterally offset enough that there is no overlap.

The first and second BAW transducers may be electrically coupled together to form part of a first BAW filter network. Using the concepts described herein, multiple BAW filter networks may be formed on single substrate for an integrated circuitry package.

In yet another embodiment, the BAW device includes a substrate, a first reflector, a first BAW transducer, and a second BAW transducer. The first reflector is provided over the substrate and comprises a first plurality of reflector layers. The first BAW transducer is provided over a first section of the first reflector and has a first piezoelectric layer of a first thickness between a first top electrode and a first bottom electrode. The second BAW transducer is provided over a second section of the first reflector and has a second piezoelectric layer of a second thickness between a second top electrode and a second bottom electrode, wherein the first thickness is different than the second thickness. In the first section of the first reflector beneath the first BAW transducer, a first average thickness of each of the first plurality of reflector layers is approximately one-quarter the wavelength (λ/4) of a first acoustic wave for a frequency at which a first acoustic mode of a first type operates in the first BAW transducer and a second acoustic wave for a second frequency at which a second acoustic mode of a second type operates. The acoustic mode of the first type may be, but is not limited to a longitudinal mode, a shear mode, a quasi-longitudinal mode, and a quasi-shear mode.

In the second section of the first reflector beneath the second BAW transducer, a second average thickness of each of the first plurality of reflector layers is approximately one-quarter the wavelength (λ/4) of a third acoustic wave for a frequency at which the first acoustic mode of the first type operates in the second BAW transducer and a fourth acoustic wave for a fourth frequency at which the second acoustic mode of the second type operates. The first average thickness is different than the second average thickness.

The concepts disclosed herein allow more resonators with different resonance frequencies to be placed in smaller footprints. The resonators can also be more accurately tuned to the desired resonance frequencies.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 9 through 14 graphically illustrate a grayscale lithography process for forming reflector layers.

Figure 15:
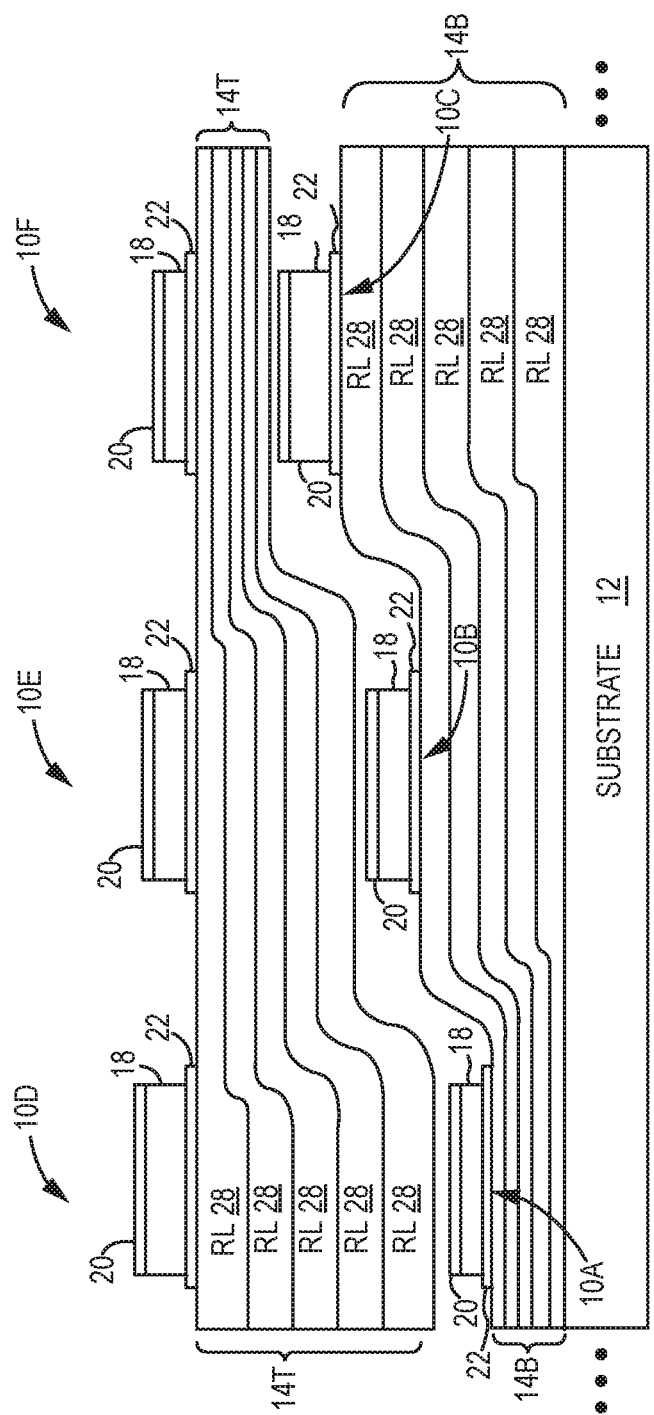

FIG. 15 illustrates a BAW structure having multiple BAW resonators over a common reflector, which has reflector layers of varying thicknesses, according to a second embodiment.

FIG. 16 illustrates a BAW structure having multiple BAW resonators over a common reflector, which has reflector layers of varying thicknesses, according to a third embodiment.

FIG. 17 illustrates a BAW structure having multiple BAW resonators over a common reflector, which has reflector layers of varying thicknesses, according to a fourth embodiment.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As disclosed herein, a BAW device includes a substrate, a first reflector, and at least two BAW transducers. The first reflector resides over the substrate and has a plurality of reflector layers. A first BAW transducer resides over a first section of the first reflector, has a first series resonance frequency, and has a first piezoelectric layer of a first thickness between a first top electrode and a first bottom electrode. The second BAW transducer resides over a second section of the first reflector, has a second series resonance frequency that is different than the first series resonance frequency, and has a second piezoelectric layer of a second thickness, which is different than the first thickness, between a second top electrode and a second bottom electrode.

In the first section of the first reflector beneath the first BAW transducer, each of at least two of the first plurality of reflector layers has a third thickness approximately one-quarter the wavelength ($\lambda/4$) of an acoustic wave for a frequency at which an acoustic mode of a first type operates in the first BAW transducer. The acoustic mode of the first type may be, but is not limited to a longitudinal mode, a shear mode, a quasi-longitudinal mode, and a quasi-shear mode. In the second section of the first reflector beneath the second BAW transducer, each of at least two of the first plurality of reflector layers has a fourth thickness approximately one-quarter the wavelength ($\lambda/4$) of an acoustic wave for a frequency at which the acoustic mode of the first type operates in the first BAW transducer. The third and fourth thicknesses are different from one another.

If the acoustic mode of the first type is a longitudinal mode, each of at least two of the reflector layers of the first reflector in the first section has a thickness approximately one-quarter the wavelength ($\lambda/4$) of a longitudinal acoustic wave at the first series resonance frequency of the first transducer. Similarly, in the second section of the first reflector beneath the second transducer, each of the at least two reflector layers has a thickness approximately one-quarter the wavelength ($\lambda/4$) of a longitudinal acoustic wave at the second series resonance frequency of the second transducer. The thicknesses of at least two reflector layers in the first section of the first reflector are different than thicknesses of at least two reflector layers in the second section of the first reflector. In certain embodiments, the at least two reflector layers are adjacent one another.

Figure 1:
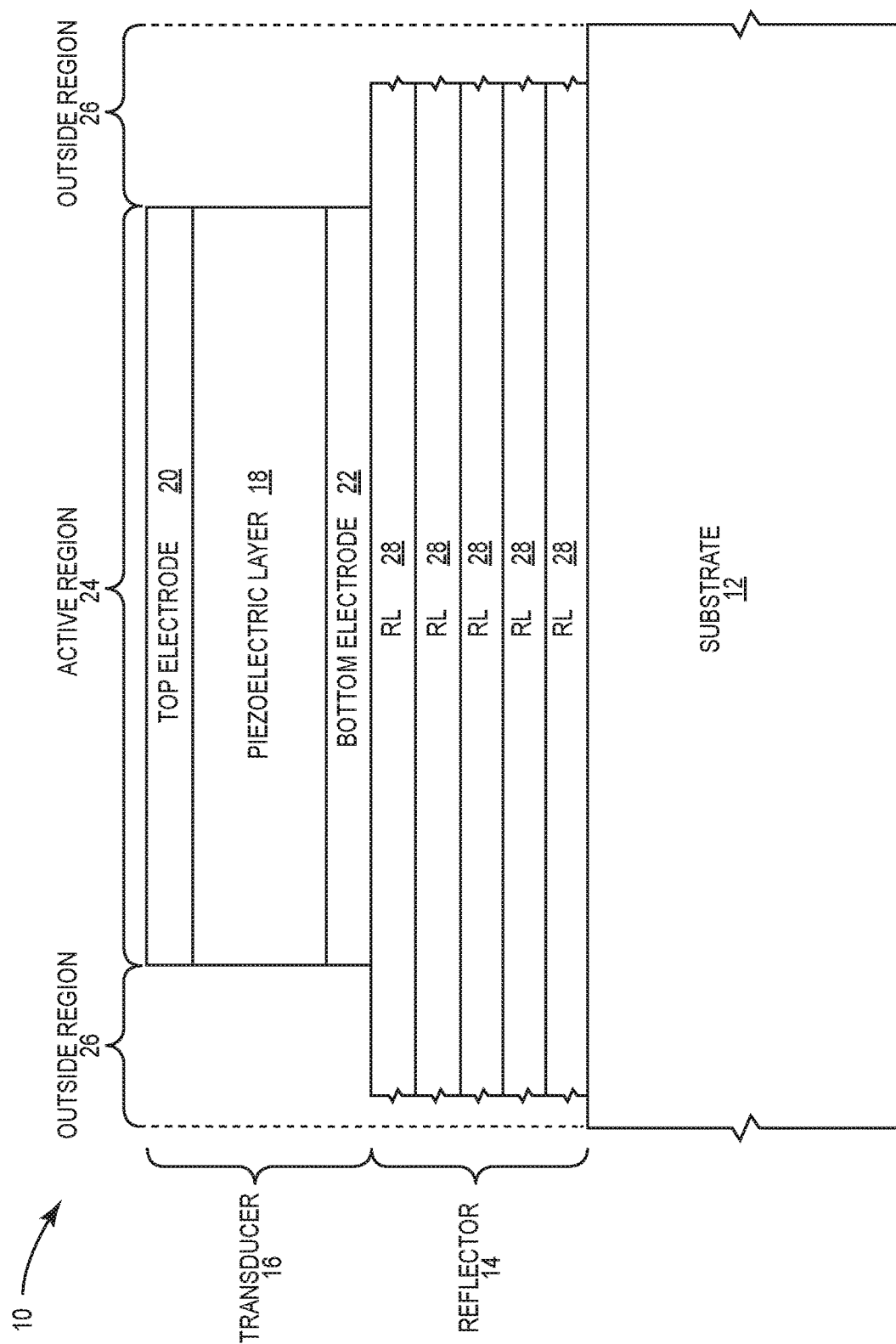
FIG. 1 illustrates a conventional Bulk Acoustic Wave (BAW) resonator.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, as illustrated, or by an air cavity, which is provided just below the transducer in a Film BAW Resonator (FBAR) (not shown).

The reflector 14 is typically formed by a stack of reflector layers (RL) 28A through 28E, which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another. Details relating to the concepts disclosed herein are provided further below.

Figure 2:
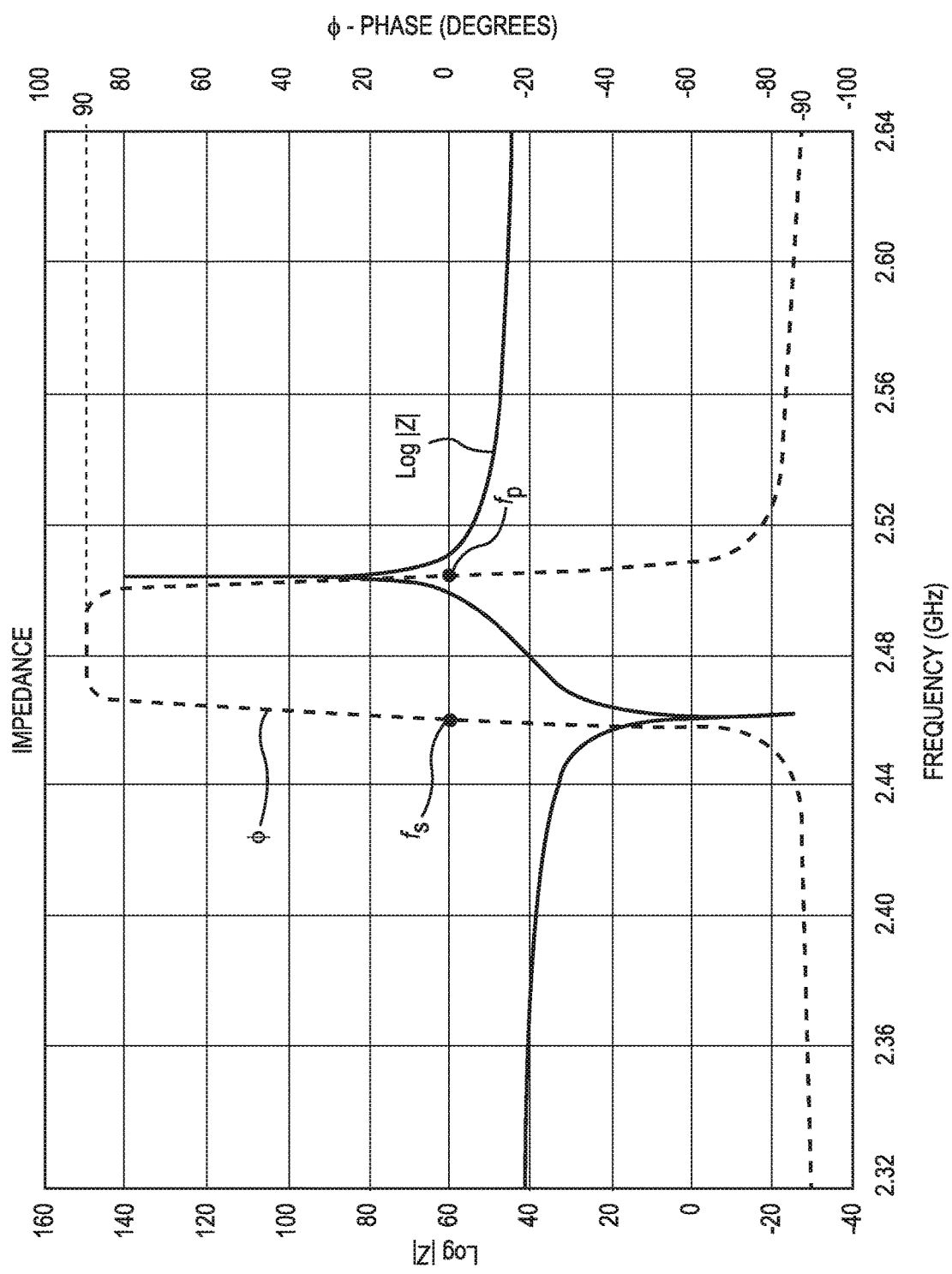
FIG. 2 is a graph of the magnitude and phase of impedance over frequency responses as a function of frequency for an ideal BAW resonator.

The magnitude (Z) and phase (φ) of the electrical impedance as a function of the frequency for a relatively ideal BAW resonator 10 is provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20 and 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near zero, resistance at the series resonance frequency (fs), and a very high resistance at the parallel resonance frequency (fp). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figure 3:
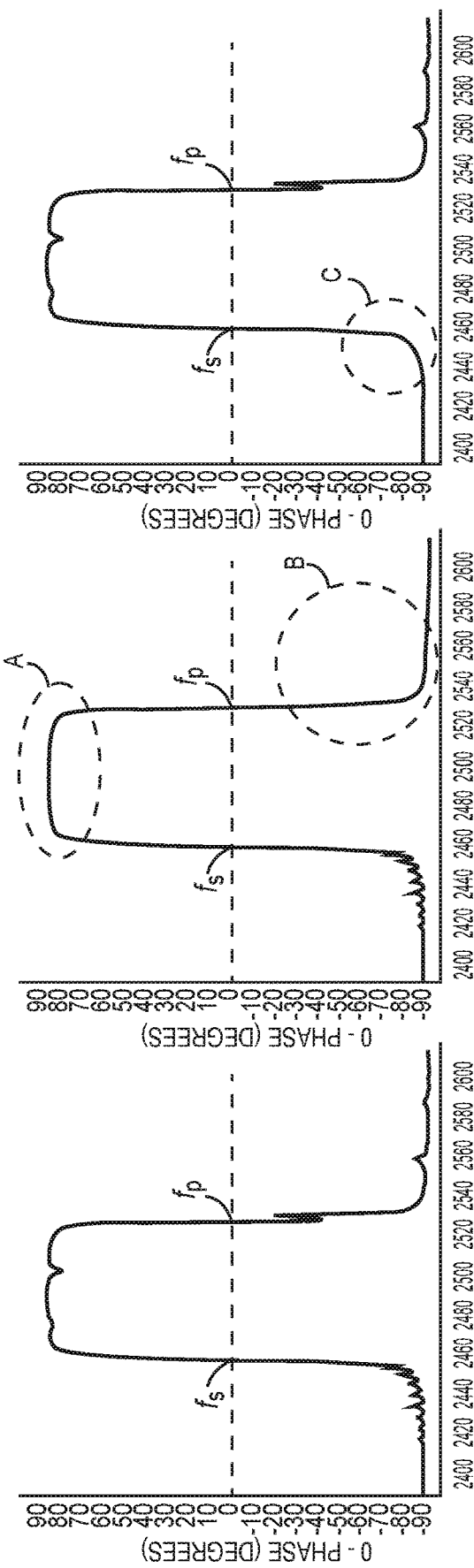
FIGS. 3A-3C are graphs of phase responses for various BAW resonator configurations.

Unfortunately, the phase (φ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically (longitudinally), various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
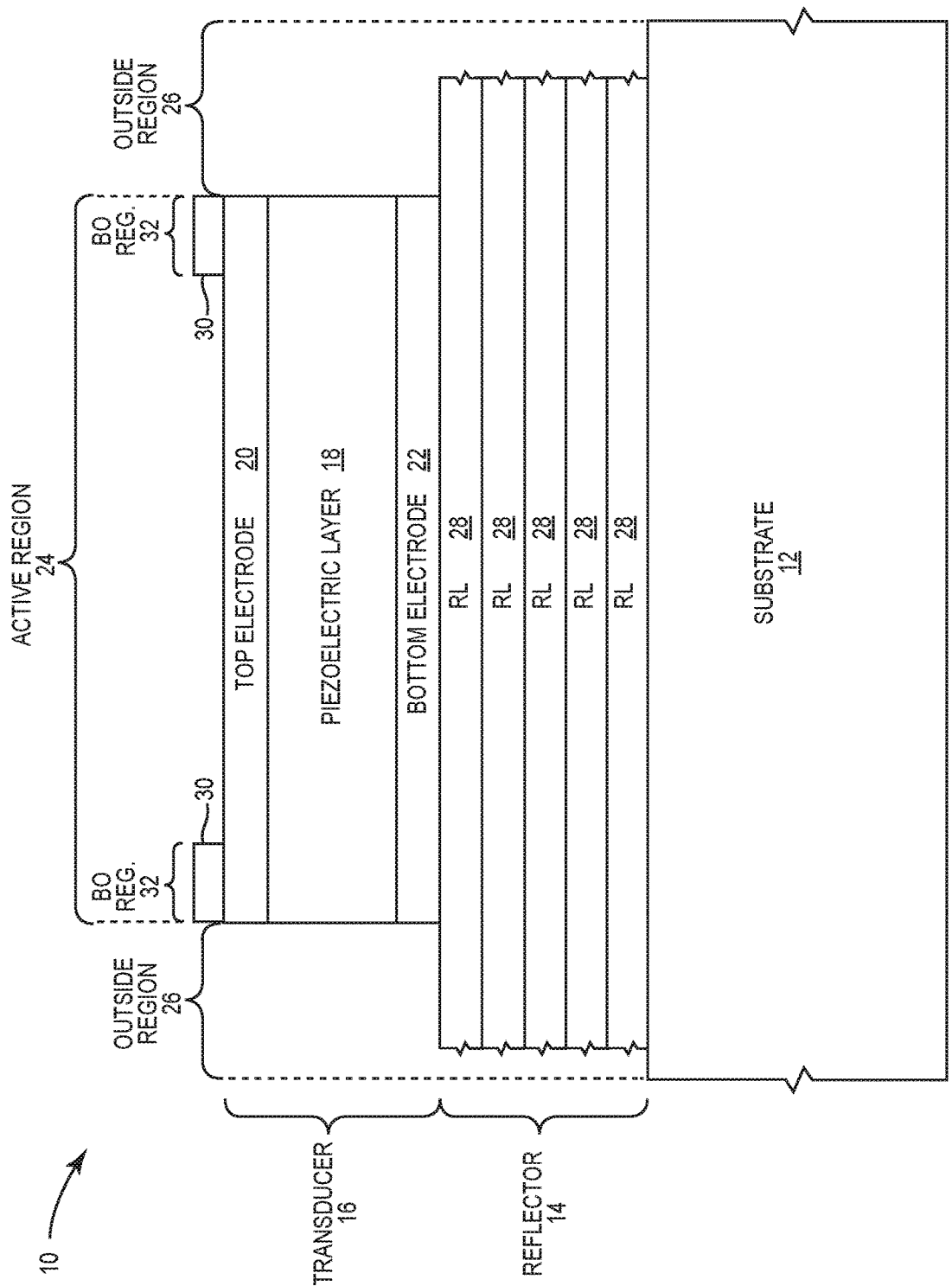
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency fp, and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonant frequency (fs). As such, the typical BAW resonator 10 employs both apodization and the BO ring 30.

Figure 5A:
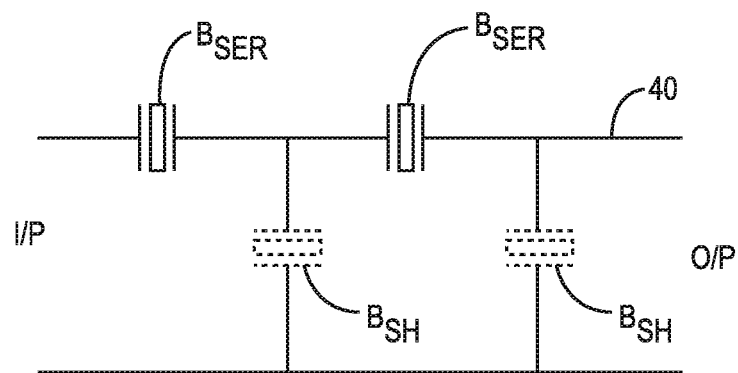
FIG. 5A is a schematic of a conventional ladder network.
Figure 5B:
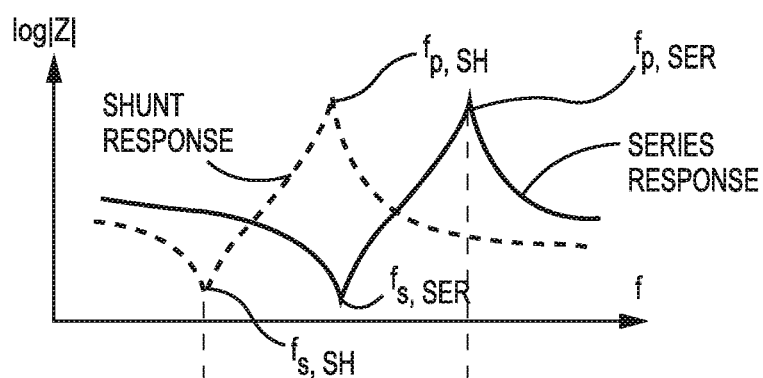
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 44 is illustrated in FIG. 5A. The ladder network 44 includes two series resonators $B_{SER}$ and two shunt resonators $B_{SH}$, which are arranged in a traditional latter configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ detuned version of the series resonators $B_{SER}$. As a result, the frequency responses for the series resonators BSER and the shunt resonators BSH are generally very similar, yet shifted relative to one another such that the parallel resonance frequency ($f_{P,SH}$), of the shunt resonators approximates the series resonance frequency ($f_{S,SER}$), of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{P,SH}$) of the shunt resonators $B_{SH}$ is less than the parallel resonance frequency ($f_{P,SER}$) of the series resonators $B_{SER}$.

Figure 5C:
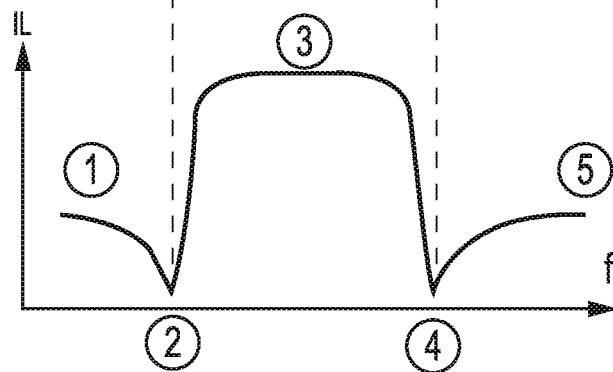

FIG. 5C is associated with FIG. 5B and illustrates the response of the ladder network 44. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{S,SH}$) of the shunt resonators $B_{SH}$ fall within the passband. FIGS. 6A through 6E provide circuit equivalents for the five phases of the response of the ladder network 44. During the first phase (phase 1, FIGS. 5C, 6A), the ladder network 44 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 44.

Figure 6A:
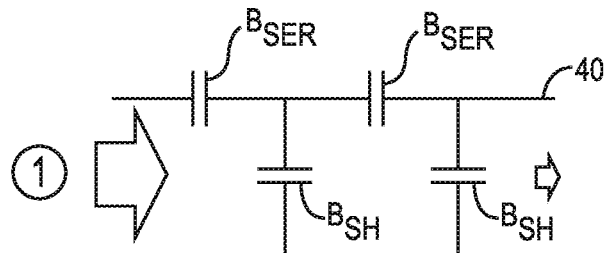
FIGS. 6A-6E are circuit equivalents for the ladder network of FIG. 5A at the frequency points 1, 2, 3, 4, and 5, which are identified in FIG. 5C.
Figure 6B:
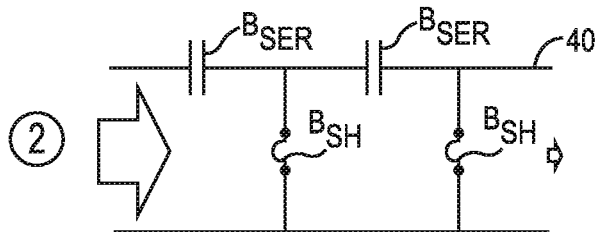
Figure 6C:
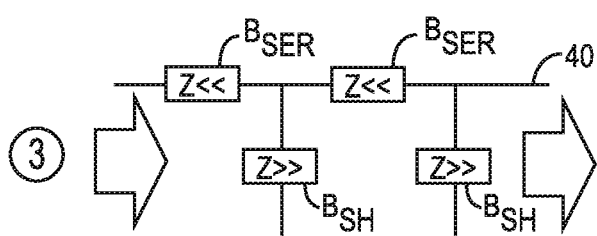
Figure 6D:
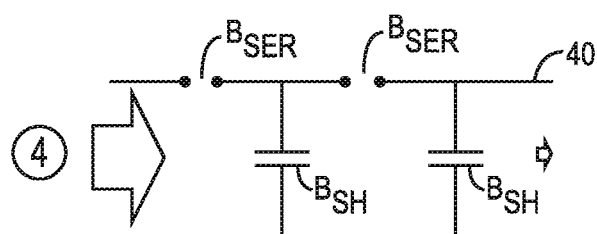
Figure 6E:
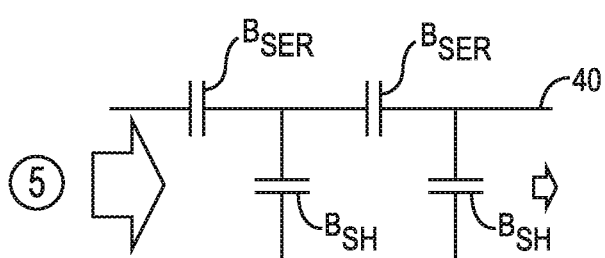

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, while the shunt resonators $B_{SH}$ present a relatively high impedance, wherein the combination of the two leads to a flat passband was steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as an open at the parallel resonance frequency ($f_{P,SER}$) of the series resonators (phase 4, FIGS. 5C, 6D).

At the parallel resonance frequency ($f_{P,SER}$) of the series resonators $B_{SER}$ (phase 4), the input signal is again essentially blocked from the output of the ladder network 44. During the final phase (phase 5, FIGS. 5C, 6E), the ladder network 44 functions to attenuate the input signal, in a similar fashion to that provided in phase 1. As the parallel resonance frequency ($f_{P,SER}$) of the series resonators $B_{SER}$ is passed, the impedance of the series resonators $B_{SER}$ decreases, and the impedance of the shunt resonators $B_{SH}$ normalize. Thus, the ladder network 44 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 44 provides extremely high attenuation at both the series resonance frequency ($f_{S,SH}$) of the shunt resonators $B_{SH}$ and the parallel resonance frequency ($f_{P,SER}$) of the series resonators. The ladder network 44 provides good attenuation below the series resonance frequency ($f_{S,SH}$) of the shunt resonators $B_{SH}$ and above the parallel resonance frequency ($f_{P,SER}$) of the series resonators $B_{SER}$.

Figure 7:
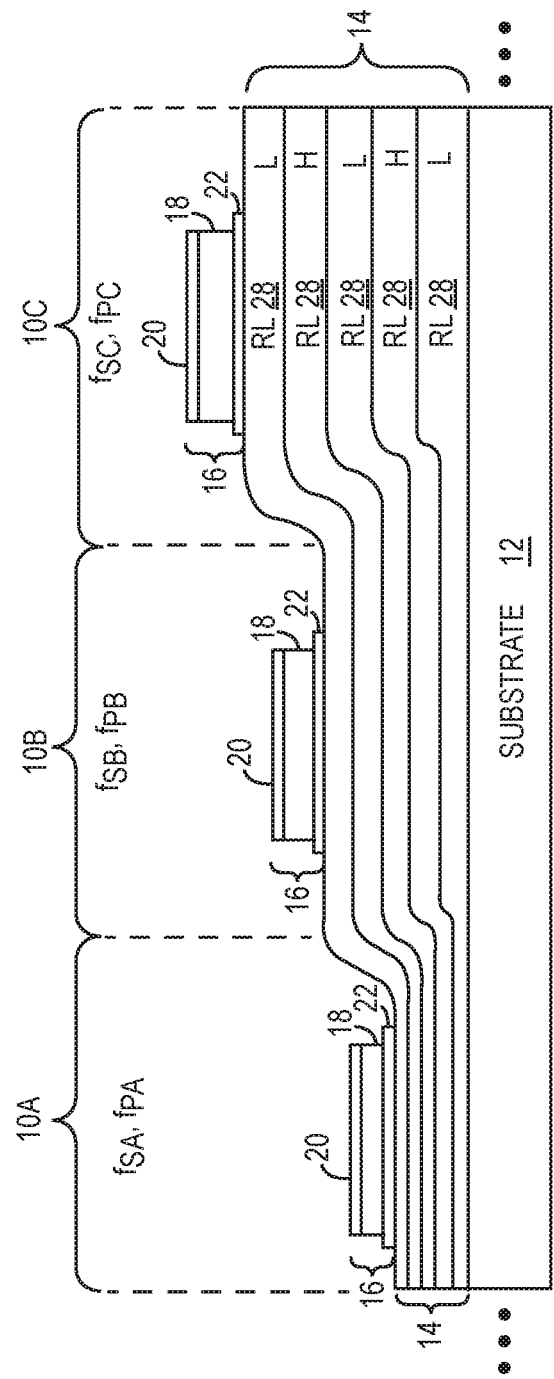
FIG. 7 illustrates a BAW structure having multiple BAW resonators over a common reflector, which has reflector layers of varying thicknesses, according to a first embodiment.

Turning now to FIG. 7, multiple BAW resonators 10A, 10B, and 10C are shown formed on a single, die level substrate 12. Each of the BAW resonators 10A, 10B, and 10C have different series resonance frequencies $f_{SA}$, $f_{SB}$, and $f_{SC}$ as well as different parallel resonance frequencies $f_{PA}$, $f_{PB}$, ad $f_{PC}$, respectively. The series and parallel resonance frequencies $f_{SA}$, $f_{SB}$, $f_{SC}$ and $f_{PA}$, $f_{PB}$, $f_{PC}$, are primarily dictated by the thicknesses of the respective piezoelectric layers 18. As illustrated in this example, the BAW resonators 10A, 10B, and 10C have piezoelectric layers 18 of increasing thickness, and thus, decreasing series and parallel resonance frequencies $f_{SA}$, $f_{SB}$, $f_{SC}$ and $f_{PA}$, $f_{PB}$, $f_{PC}$.

While various materials and mass loading associated surrounding structures contribute, the different series resonance frequencies $f_{SA}$, $f_{SB}$, and $f_{SC}$ for the BAW resonators 10A, 10B, and 10C generally correspond to the different thicknesses of the corresponding piezoelectric layers 18. For BAW resonator 10A, the thickness of the piezoelectric layer 18 is approximately one-half the wavelength ($\lambda/2$) of a longitudinal acoustic wave at the series resonance frequency $f_{SA}$ for the BAW resonator 10A, where $\lambda=v/f$, $\lambda$ is the wavelength of the longitudinal (vertically propagating) acoustic wave, f is the frequency of the longitudinal acoustic wave, and v is the acoustic velocity for the material in which the longitudinal wave is traveling. A longitudinal wave is one that propagates in a direction that is orthogonal to the plane in which the piezoelectric layer resides. For BAW resonator 10B, the thickness of the piezoelectric layer 18 is approximately one-half the wavelength ($\lambda/2$) of a longitudinal acoustic wave at the series resonance frequency $f_{SB}$ for the BAW resonator 10B. For BAW resonator 10C, the thickness of the piezoelectric layer 18 is approximately one-half the wavelength ($\lambda/2$) of a longitudinal acoustic wave at the series resonance frequency $f_{SC}$ for the BAW resonator 10C. As illustrated, the piezoelectric layer 18 for BAW resonator 10C is thicker than the piezoelectric layer 18 for BAW resonator 10B, and the piezoelectric layer 18 for BAW resonator 10B is thicker than the piezoelectric layer 18 for BAW resonator 10A, which indicates that the series resonance frequency $f_{SA}$>series resonance frequency $f_{SB}$>series resonance frequency $f_{SC}$.

In an effort to better optimize the performance of the BAW resonators 10A, 10B, and 10C, which have different series resonance frequencies $f_{SA}$, $f_{SB}$, and $f_{SC}$, those portions of the reflector 14 that reside directly below the transducers 16 for each of the BAW resonators 10A, 10B, and 10C are specifically tailored to better confine acoustic waves within the respective transducers 16. As illustrated, the reflector 14 provides the reflector layers 28 for each of the BAW resonators 10A, 10B, and 10C; however, since each of the BAW resonators 10A, 10B, and 10C has a different series resonance frequency $f_{SA}$, $f_{SB}$, and $f_{SC}$, the reflector layers 28 for each of the BAW resonators 10A, 10B, and 10C will differ in thickness. Like the piezoelectric layers 18 for the BAW resonators 10A, 10B, and 10C, the thickness of each of reflector layers 28 increases for each of the BAW resonators 10A, 10B, and 10C.

The thicknesses of the reflector layers 28 for the BAW resonators 10A, 10B, and 10C vary as a function of the different series resonance frequencies $f_{SA}$, $f_{SB}$, and $f_{SC}$ of the BAW resonators 10A, 10B, and 10C and of the type of material used for the reflector layers 28. For each of the BAW resonators 10A, 10B, and 10C, the thicknesses of at least two adjacent reflector layers 28, if not all of the reflector layers 28, generally correspond to one-quarter the wavelength ($\lambda/4$) of an acoustic wave for a frequency at which an acoustic mode of a certain type operates in the associated BAW transducer 16. The acoustic mode may be, but is not limited to, a longitudinal mode, a shear mode, a quasi-longitudinal mode, and a quasi-shear mode. The following description relates to the acoustic mode corresponding to a longitudinal mode, but those skilled in the art will recognize that the other modes are applicable. In certain embodiments many, if not all of the reflector layers 28 are essentially of the same thickness. In other embodiments, the reflector layers 28 need not be identical in thickness, wherein at least two of the reflector layers 28 have different thicknesses, but the average thickness of the reflector layers 28 for a given transducer 16 will correspond to one-quarter the wavelength (λ/4) of an acoustic wave for a frequency at which an acoustic mode of a certain type operates in the associated BAW transducer 16.

For a longitudinal mode, the thicknesses of at least two adjacent reflector layers 28, if not all of the reflector layers 28, generally correspond to one-quarter the wavelength (λ/4) of the longitudinal acoustic waves at the respective series resonance frequencies $f_{SA}$, $f_{SB}$, and $f_{SC}$ of the BAW resonators 10A, 10B, and 10C. Accordingly, for BAW resonator 10A, the thickness of at least two adjacent reflector layers 28 below the transducer 16 for BAW resonator 10A is approximately one-quarter the wavelength (λ/4) of the longitudinal acoustic wave at the series resonance frequency $f_{SA}$ for the BAW resonator 10A. For BAW resonator 10B, the thickness of at least two of the reflector layers 28 below the transducer 16 for BAW resonator 10B is approximately one-quarter the wavelength (λ/4) of the longitudinal acoustic wave at the series resonance frequency $f_{SB}$ for the BAW resonator 10B. For BAW resonator 10C, the thickness of at least two of the reflector layers 28 below the transducer 16 for BAW resonator 10C is approximately one-quarter the wavelength (λ/4) of the longitudinal acoustic wave at the series resonance frequency $f_{SC}$ for the BAW resonator 10C. As illustrated, the reflector layers 28 below BAW resonator 10C are generally thicker than the reflector layers 28 below BAW resonator 10B, and the reflector layers 28 below BAW resonator 10B are generally thicker than the reflector layers 28 below BAW resonator 10A, which again indicates that the series resonance frequency $f_{SA}$>series resonance frequency $f_{SB}$>series resonance frequency $f_{SC}$.

With regard to thicknesses of the reflector layers 28, the phrase "a thickness approximately one-quarter the wavelength (λ/4) of the longitudinal acoustic wave at the series resonance frequency $f_{SX}$ for a BAW resonator X" is defined to mean a nominal thickness within +/− five (5) percent of one-quarter the wavelength (λ/4) of the series resonance frequency $f_{SX}$ for the BAW resonator X. With regard to thicknesses of the piezoelectric layers 18, the phrase "a thickness approximately one-half the wavelength (λ/2) of the longitudinal acoustic wave at the series resonance frequency $f_{SX}$ for a BAW resonator X" is defined to mean a nominal thickness within +/−five (5) percent of one-half the wavelength (λ/2) of the series resonance frequency $f_{SX}$ for the BAW resonator X.

In certain embodiments, three, four, five, or more, if not all, of the reflector layers 28 are adjacent one another, have thicknesses corresponding to one-quarter the wavelength (λ/4) of the longitudinal acoustic wave at the series resonance frequency $f_{SX}$ for the BAW resonator 10, and alternate between having low (L) and high (H) acoustic impedances. As such, as the series resonance frequency $f_{SX}$ decreases, the thickness of each of the reflector layers 28 of the reflector 14 and piezoelectric layers 18 for the BAW resonators 10A, 10B, and 10C increases, and vice versa. Further, since the wavelength and velocity of the longitudinal acoustic wave is a function of the material used for the reflector layers 28, the thicknesses of the reflector layers 28 for a given BAW resonator 10 may differ from one another and still have a thickness that corresponds to one-quarter the wavelength (λ/4) of the longitudinal acoustic wave at the series resonance frequency $f_{SX}$ for the BAW resonator 10.

Figure 8:
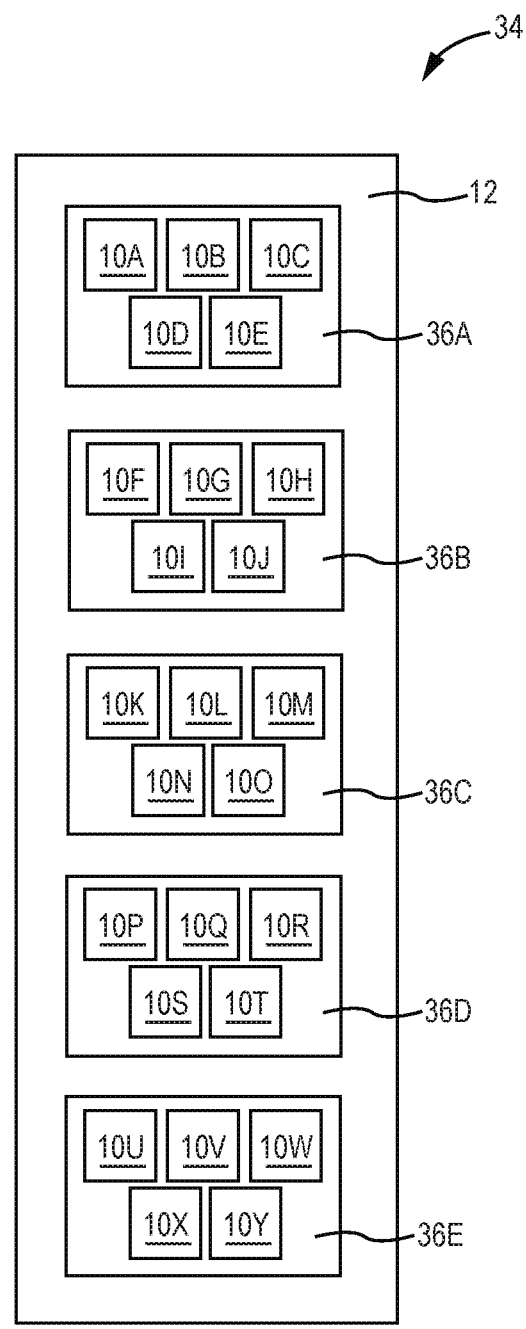
FIG. 8 illustrates a substrate having multiple BAW filters that employ multiple BAW resonators.
Figure 9:
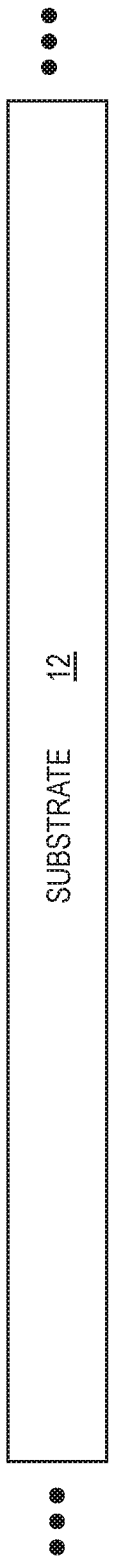

While there are three BAW resonators 10A, 10B, and 10C with different series resonance frequencies $f_{SA}$, $f_{SB}$, and $f_{SC}$ illustrated in FIG. 7, any number of BAW resonators 10 may be provided on the substrate 12 wherein multiple ones of the BAW resonators 10 have the same or different series resonance frequencies $f_{SX}$. One or more groups of these BAW resonators 10 may be coupled to one another to form one or more filters on a single substrate 12. For example, FIG. 8 illustrates a single die 34, wherein five ladder network filters 36A-36E, which incorporate the concepts described above, are formed on the substrate 12. Ladder network filter 36A includes BAW resonators 10A-10E, which are connected to form a ladder network and wherein at least two of the BAW resonators 10A-10E have different series resonance frequencies $f_S$, all of the BAW resonators 10A-10E share a common reflector 14, and at least certain reflector layers 28 of the reflector 14 vary in thickness as described above. Similarly, ladder network filter 36B includes BAW resonators 10F-10J; ladder network filter 36C includes BAW resonators 10K-10O; ladder network filter 36D includes BAW resonators 10P-10T; and ladder network filter 36E includes BAW resonators 10U-10Y.

Figure 10:
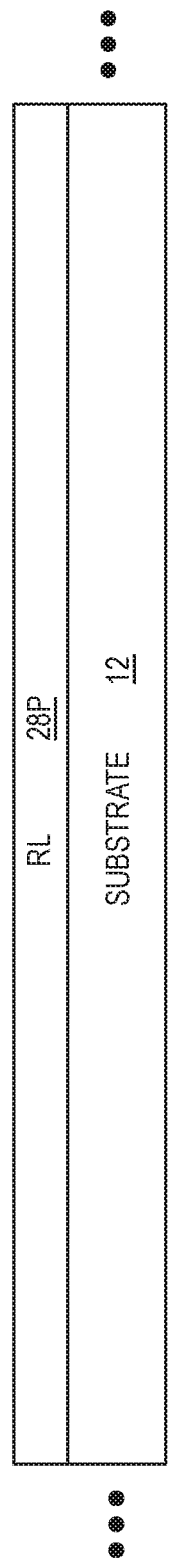
Figure 11:
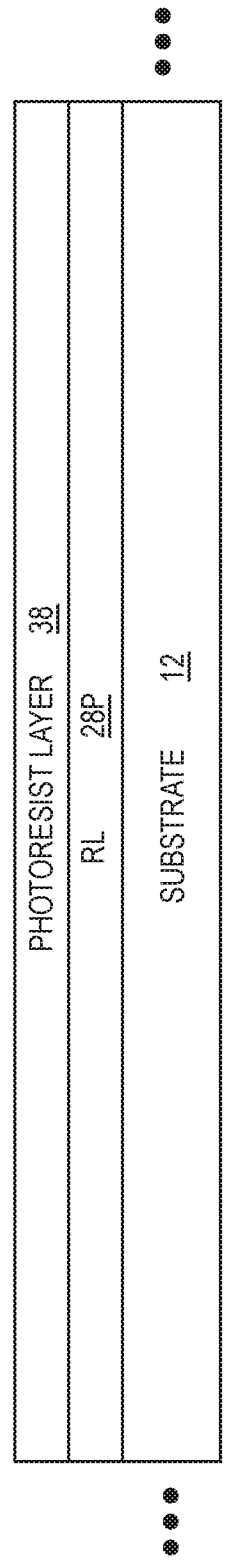
Figure 12:
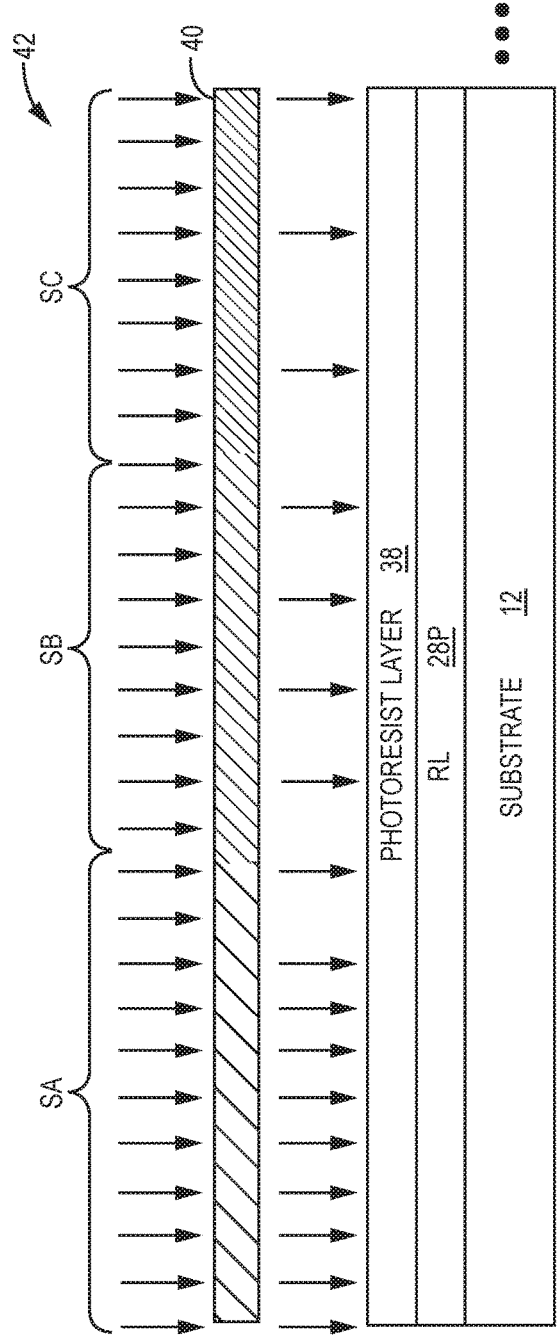
Figure 13:
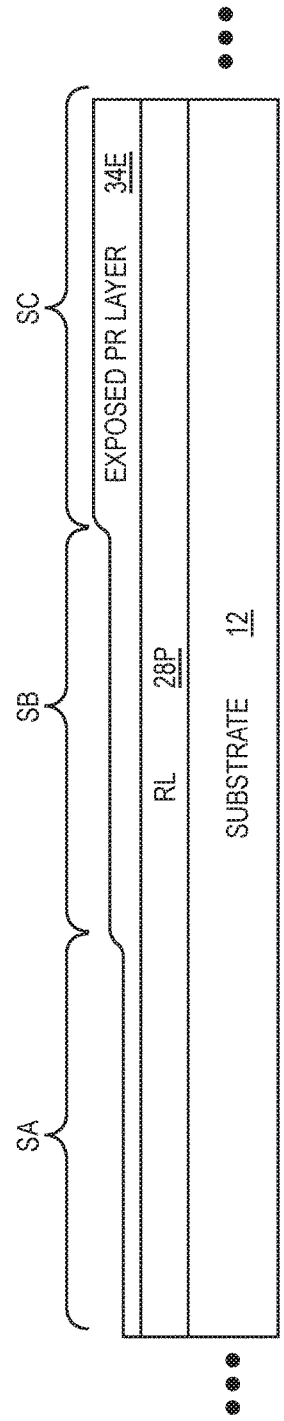
Figure 14:
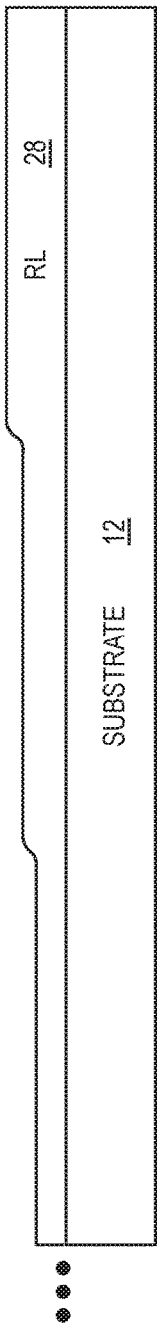

An exemplary grayscale lithography process for creating reflector layers 28, which vary in thickness across different BAW resonators 10, is illustrated in FIGS. 9 through 14. This embodiment corresponds to the embodiment illustrated in FIG. 7, which illustrates three BAW resonators 10A, 10B, and 10C. Initially, a substrate 12 is provided (FIG. 9), and a provisional reflector layers 28P is provided over the top surface of the substrate 12 (FIG. 10). A photoresist layer 38 is provided over the top surface of the provisional reflector layer 28P (FIG. 11). Next, different portions of the photoresist layer 38 are exposed to either different concentrations of light for a given amount of time or the same concentrations of light for varying amounts of time. Section SA corresponds to BAW resonator 10A, section SB corresponds to BAW resonator 10B, and section SC corresponds to BAW resonator 10C (FIG. 12). As illustrated, a light filter 40 that has graduated filter characteristics is provided over the photoresist layer 38, such that different portions of the photoresist layer 38 are exposed to different amounts of light 42, and as such, are thinned to different degrees. As a result, section SA of the photoresist layer 38 is thinned the most, section SB of the photoresist layer 38 is thinned to an intermediate level, and section SC of the photoresist layer 38 is thinned the least, wherein the resultant exposed photoresist layer 34E has a stepped profile with the appropriate thicknesses for each of the BAW resonators 10A, 10B, and 10C (FIG. 13). Finally, the exposed photoresist layer 34E, and at least parts of the provisional reflector layer 28P, are etched using an appropriate etchant, such that the exposed photoresist layer 34E is removed, and the provisional reflector layers 28P is etched into the reflector layers 28, which has the desired stepped profile (FIG. 14). Each of the subsequent reflector layers 28 as well as the piezoelectric layer 18 for each of the BAW resonators 10A, 10B, and 10C may be formed in this manner. Other techniques for forming the various reflector layers 28 and the piezoelectric layer 18 for each of the BAW resonators 10A, 10B, and 10C include successive conventional photolithography pattern and etch steps, nano-imprint lithography (NIL) to directly pattern various thicknesses of resists in a single or multiple stamping steps, and direct-write ion etching/milling using various exposure times for the different resonators.

As illustrated in FIG. 15, multiple layers of BAW resonators 10 may be provided over the substrate 12. As illustrated, BAW resonators 10A, 10B, and 10C reside over a bottom reflector 14B, which resides directly on the substrate 12. The reflector layers 28 of the bottom reflector 14B vary in thickness as described above in association with FIG. 7. A top reflector 14T is provided over the BAW resonators 10A, 10B, and 10C, wherein the portion of the top reflector 14T that has the thicker reflector layers 28 is provided over BAW resonator 10A. The portion of the top reflector 14T that has the thinner reflector layers 28 is provided over the BAW resonator 10C. The portion of the top reflector 14T that has the reflector layers 28 of an intermediate thickness is provided over the BAW resonator 10B. Transducers 16 for additional BAW resonators 10D, 10E, and 10F are provided over the top reflector 14T, wherein the transducer 16 for the BAW resonator 10D is over the portion of the top reflector 14T that has the thicker reflector layers 28, the transducer 16 for the BAW resonator 10E is over the portion of the top reflector 14T that has the intermediate thickness reflector layers 28, and the transducer 16 for the BAW resonator 10F is over the portion of the top reflector 14T that has the thinner reflector layers 28. As illustrated, the transducer 16 for the BAW resonator 10D is aligned over the transducer 16 for the BAW resonator 10A, the transducer 16 for the BAW resonator 10E is aligned over the transducer 16 for the BAW resonator 10B, and the transducer 16 for the BAW resonator 10F is aligned over the transducer 16 for the BAW resonator 10C. However, such alignment is not necessary.

As illustrated in FIG. 16, the vertically stacked BAW resonators 10G and 10H are laterally, or horizontally, offset from one another such that no portion of the transducers 16 of the BAW resonators 10G and 10H overlap with one another. In other embodiments (not illustrated), only portions of the transducers 16 of the BAW resonators 10 overlap with one another. FIG. 17 illustrates an embodiment with three reflectors: bottom reflector 14B, top reflector 14T, and middle reflector 14M, which resides between the bottom reflector 14B and the top reflector 14T. Transducers 16 for BAW resonators 10I, 10J, and 10K, reside directly on the bottom reflector 14B, middle reflector 14M, and top reflector 14T, respectively. These transducers 16 are shown as being laterally offset from one another, but they could be aligned with one another such that the transducers 16 reside directly over one another.

In the various embodiments, such as those illustrated FIGS. 7 and 15, the reflector 14 increases in thickness in a stepwise progression; however, such configuration is for illustrative purposes only. In practice, multiple transducers 16 for multiple BAW resonators 10 may be provided in a two-dimensional grid-like pattern over sections of the reflector 14 that have varying thicknesses based on the desired series resonance frequencies $f_S$ of the resulting BAW resonators 10.

The concepts described herein allow designers to place more BAW resonators 10 that have different series and parallel resonance frequencies $f_S$, $f_P$, in much less space. Regardless of the differing series and parallel resonance frequencies $f_S$, $f_P$, each of the BAW resonators 10 will have optimized reflectors 14 that are essentially tuned for its specific series and parallel resonance frequencies $f_S$, $f_P$. Being able to optimize the reflectors 14 for each of the BAW resonators 10 enhances the overall performance (Q, insertion loss, frequency response, phase response, etc.) of the BAW resonators 10.

Those skilled in the art will recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) device comprising: a substrate comprising a planar surface; a first reflector over the substrate and comprising a first plurality of reflector layers; a first BAW transducer over a first section of the first reflector that is over the planar surface of the substrate, having a first series resonance frequency, and comprising a first piezoelectric layer of a first thickness between a first top electrode and a first bottom electrode; and a second BAW transducer over a second section of the first reflector that is over the planar surface of the substrate, having a second series resonance frequency that is different than the first series resonance frequency, and comprising a second piezoelectric layer of a second thickness between a second top electrode and a second bottom electrode, wherein: the first thickness is different than the second thickness; in the first section of the first reflector beneath the first BAW transducer, each of at least two of the first plurality of reflector layers has a third thickness approximately one-quarter the wavelength ($\lambda/4$) of an acoustic wave for a frequency at which an acoustic mode of a first type operates in the first BAW transducer; in the second section of the first reflector beneath the second BAW transducer, each of at least two of the first plurality of reflector layers has a fourth thickness approximately one-quarter the wavelength ($\lambda/4$) of an acoustic wave for a frequency at which the acoustic mode of the first type operates in the second BAW transducer; and the third thickness is different than the fourth thickness; a second reflector over the substrate and comprising a second plurality of reflector layers; a third BAW transducer over a first section of the second reflector and comprising a third piezoelectric layer between a third top electrode and a third bottom electrode; and a fourth BAW transducer over a second section of the second reflector and comprising a fourth piezoelectric layer between a fourth top electrode and a fourth bottom electrode; wherein the third BAW transducer is laterally offset from the first BAW transducer, such that the third BAW transducer only partially overlaps the first BAW transducer.

2. The BAW device of claim 1 wherein the acoustic mode of the first type is a longitudinal mode.

3. The BAW device of claim 1 wherein the acoustic mode of the first type is a shear mode.

4. The BAW device of claim 1 wherein the acoustic mode of the first type is a quasi-longitudinal mode.

5. The BAW device of claim 1 wherein the acoustic mode of the first type is a quasi-shear mode.

6. The BAW device of claim 1 wherein:
in the second section of the first reflector beneath the second BAW transducer, each of the first plurality of reflector layers has the fourth thickness.

7. The BAW device of claim 1 wherein:
the first section of the first reflector beneath the first BAW transducer has a different thickness than the second section of the first reflector beneath the second BAW transducer; and
the first reflector consists of a first number of reflector layers beneath the first BAW transducer and the second BAW transducer.

8. The BAW device of claim 1 further comprising:
an additional BAW transducer over a third section of the first reflector, having a third series resonance frequency that is different than the first and second series resonance frequencies, and comprising an additional piezoelectric layer of a thickness different than the first and second thicknesses and between an additional top electrode and an additional bottom electrode, wherein:
in the third section of the first reflector beneath the first BAW transducer, each of at least two of the first plurality of reflector layers has a fifth thickness approximately one-quarter the wavelength ($\lambda/4$) of an acoustic wave for a frequency at which the acoustic mode of the first type operates in the additional BAW transducer.

9. The BAW device of claim 1 wherein the at least two of the first plurality of reflector layers are adjacent one another.

10. The BAW device of claim 1 wherein:
in the first section of the first reflector beneath the first BAW transducer, each of at least four of the first plurality of reflector layers has the third thickness; and
in the second section of the first reflector beneath the second BAW transducer, each of at least four of the first plurality of reflector layers has the fourth thickness, wherein there are no intervening layers between any of the at least four of the first plurality of reflector layers.

11. The BAW device of claim 1 further comprising a third an additional BAW transducer over a third section of the first reflector, having a third series resonance frequency that is different than the first series resonance frequency and the second series resonance frequency, and comprising an additional piezoelectric layer between an additional top electrode and an additional bottom electrode, wherein:
a thickness of the additional piezoelectric layer is different from the first thickness and the second thickness; and
each of at least two of the first plurality of reflector layers in the third section of the first reflector beneath the additional BAW transducer has a thickness approximately one-quarter the wavelength ($\lambda/4$) of a longitudinal acoustic wave at the third series resonance frequency of the additional BAW transducer.

12. The BAW device of claim 1 wherein:
a series resonance frequency of the third BAW transducer is different than a series resonance frequency of the fourth BAW transducer;
a thickness of the third piezoelectric layer is different than a thickness of the fourth piezoelectric layer;
each of at least two of the second plurality of reflector layers in the first section of the second reflector beneath the third BAW transducer has a fifth thickness approximately one-quarter the wavelength ($\lambda/4$) of an acoustic wave for a frequency at which the acoustic mode of the first type operates in the third BAW transducer; and
each of at least two of the second plurality of reflector layers in the second section of the second reflector beneath the fourth BAW transducer has a thickness approximately one-quarter the wavelength ($\lambda/4$) of an acoustic wave for a frequency at which the acoustic mode of the first type operates in the fourth BAW transducer.

13. The BAW device of claim 12 wherein the third BAW transducer is laterally aligned over the first BAW transducer.

14. The BAW device of claim 13 wherein the fourth BAW transducer is laterally aligned over the second BAW transducer.

15. The BAW device of claim 12 wherein the fourth BAW transducer is laterally offset from the second BAW transducer, such that the fourth BAW transducer only partially overlaps the second BAW transducer.

16. The BAW device of claim 12 wherein the third BAW transducer is laterally offset from the first BAW transducer, such that the third BAW transducer does not overlap the first BAW transducer.

17. The BAW device of claim 16 wherein the fourth BAW transducer is laterally offset from the second BAW transducer, such that the fourth BAW transducer does not overlap the second BAW transducer.

18. The BAW device of claim 1 wherein the first BAW transducer and the second BAW transducer are electrically coupled together to form part of a first BAW filter network.

19. The BAW device of claim 18 further comprising a plurality of additional BAW transducers that are formed over the substrate and electrically coupled to the first BAW transducer and the second BAW transducer to form part of the first BAW filter network.

20. The BAW device of claim 18 further comprising a plurality of additional BAW transducers that are formed over the substrate and electrically coupled to one another to form part of a second BAW filter network.

21. The BAW device of claim 1 wherein a first of the at least two of the first plurality of reflector layers has a lower acoustic impedance and a second of the at least two of the first plurality of reflector layers has a higher acoustic impedance, which is higher than the lower acoustic impedance.

22. The BAW device of claim 1 wherein the first piezoelectric layer and the second piezoelectric layer comprise aluminum nitride.

23. The BAW device of claim 1 wherein the second reflector is over the first BAW transducer and the second BAW transducer, and thicknesses of at least two of the second plurality of reflector layers in the first section of the second reflector are different than thicknesses of at least two of the second plurality of reflector layers in the second section of the second reflector.

24. The BAW device of claim 17 wherein the at least two of the first plurality of reflector layers are adjacent one another and the at least two of the second plurality of reflector layers are adjacent one another.

* * * * *

UNITED STATES PATENT AND TRADEMARK OFFICE
CERTIFICATE OF CORRECTION

PATENT NO. : 10,601,398 B2
APPLICATION NO. : 15/953080
DATED : March 24, 2020
INVENTOR(S) : Dana Jay Sturzebecher et al.

Page 1 of 1

It is certified that error appears in the above-identified patent and that said Letters Patent is hereby corrected as shown below:

In the Claims

Column 15, Lines 15-16, Claim 11, replace "The BAW device of claim 1 further comprising a third an additional BAW transducer" with --The BAW device of claim 1 further comprising an additional BAW transducer--.

Signed and Sealed this
Nineteenth Day of May, 2020

Andrei Iancu
*Director of the United States Patent and Trademark Office*